(12) United States Patent
Li et al.

(10) Patent No.: US 12,733,258 B2
(45) Date of Patent: Sep. 8, 2026

(54) DISPLAY SUBSTRATE, METHOD FOR MANUFACTURING THE SAME, AND DISPLAY DEVICE

(71) Applicants: ORDOS YUANSHENG OPTOELECTRONICS CO., LTD., Ordos (CN); BOE TECHNOLOGY GROUP CO., LTD., Beijing (CN)

(72) Inventors: Kai Li, Beijing (CN); Yezhou Fang, Beijing (CN); Feng Li, Beijing (CN); Hong Liu, Beijing (CN); Yuzhang Wang, Beijing (CN); Zhiguang Cai, Beijing (CN); Shan Yan, Beijing (CN); Chunjing Liu, Beijing (CN)

(73) Assignees: ORDOS YUANSHENG OPTOELECTRONICS CO., LTD., Ordos (CN); BOE TECHNOLOGY GROUP CO., LTD., Beijing (CN)

( * ) Notice: Subject to any disclaimer, the term of this patent is extended or adjusted under 35 U.S.C. 154(b) by 547 days.

(21) Appl. No.: 18/027,109

(22) PCT Filed: Mar. 1, 2022

(86) PCT No.: PCT/CN2022/078569

§ 371 (c)(1),
(2) Date: Mar. 19, 2023

(87) PCT Pub. No.: WO2023/164793

PCT Pub. Date: Sep. 7, 2023

(65) Prior Publication Data

US 2024/0304632 A1 Sep. 12, 2024

(51) Int. Cl.

*H10D 86/40* (2025.01)
*H10D 86/01* (2025.01)
*H10D 86/60* (2025.01)

(52) U.S. Cl.

CPC ......... *H10D 86/60* (2025.01); *H10D 86/0231* (2025.01); *H10D 86/441* (2025.01)

(58) Field of Classification Search

CPC .. H10D 86/60; H10D 86/0231; H10D 86/441; H01L 21/77

See application file for complete search history.

(56) References Cited

U.S. PATENT DOCUMENTS 10,847,734 B2 * 11/2020 Namkung ............ H10K 77/111
2008/0043195 A1 * 2/2008 Shiki ................ H01L 23/49838
349/150

(Continued)

FOREIGN PATENT DOCUMENTS

CN 106200281 A 12/2016
CN 107367908 A 11/2017

(Continued)

OTHER PUBLICATIONS

Office Action dated Mar. 4, 2026, issued in counterpart CN Application No. 202280000368.0, with English translation. (21 pages).

*Primary Examiner* — Fatima N Farokhrooz
(74) *Attorney, Agent, or Firm* — WHDA, LLP

(57) ABSTRACT

This application provides a display substrate, a method for manufacturing the same, and a display device, which belongs to the technical field of displays. The method for manufacturing the display substrate comprises: forming a metal layer on a base substrate; forming a photoresist layer on the metal layer; exposing the photoresist layer by using a mask plate; developing the exposed photoresist layer to form a photoresist pattern; and omitting a step of baking the photoresist pattern, and etching the metal layer by using the photoresist pattern as a mask to form a signal line. The technical solution of the present disclosure can realize a narrow frame of a display product.

8 Claims, 8 Drawing Sheets display area

(56) References Cited

U.S. PATENT DOCUMENTS

2018/0292698 A1* 10/2018 Koide ................. G02F 1/13454
2022/0069051 A1* 3/2022 Lee ...................... H10K 59/122
2022/0080697 A1 3/2022 Cao et al.
2022/0147171 A1* 5/2022 Huang .................. G06F 3/0446
2023/0186843 A1* 6/2023 Wang ....................... G09G 3/32
345/55

FOREIGN PATENT DOCUMENTS

CN 108470522 A 8/2018
CN 110083021 A 8/2019
CN 107900619 B 2/2020
CN 111816118 A * 10/2020 ........... H10K 59/873
CN 112053632 A 12/2020
CN 212255944 U * 12/2020
CN 113031387 A 6/2021
TW 479277 B 3/2002

* cited by examiner

DISPLAY SUBSTRATE, METHOD FOR MANUFACTURING THE SAME, AND DISPLAY DEVICE

This application is the U.S. national phase of PCT Application No. PCT/CN2022/078569 filed on Mar. 1, 2022, the entire contents of which are hereby incorporated by reference.

TECHNICAL FIELD

The present disclosure relates to the technical field of displays, and more particularly, relates to a display substrate, a method for manufacturing the same, and a display device.

BACKGROUND

With the continuous innovation and development of display products and the continuous update of user needs, full screens are more and more popular in the market. The realization of full screen mainly lies in the continuous compression of a frame of the display screen, but limited by the technical ability, the existing display screen frame is still large, and cannot realize the real full screen.

SUMMARY

The technical problem to be solved by the present disclosure is to provide a display substrate, a method for manufacturing the same, and a display device, which can realize a narrow frame of a display product.

In order to solve the above technical problem, the embodiments of the present disclosure provide the following technical solutions.

In one aspect, provided is a method for manufacturing a display substrate, including:

- forming a metal layer on a base substrate;
- forming a photoresist layer on the metal layer;
- exposing the photoresist layer by using a mask plate;
- developing the exposed photoresist layer to form a photoresist pattern; and
- omitting a step of baking the photoresist pattern, and etching the metal layer by using the photoresist pattern as a mask to form a signal line.

In some embodiments, after forming the signal line, the method further includes ashing a photoresist by using a bias power of 3500 W to 6000 W.

In some embodiments, an etching gas used for ashing the photoresist is oxygen gas with a gas flow rate of 800 sccm to 1000 sccm.

In some embodiments, the developing the exposed photoresist layer includes: in a process of development, replenishing a developing solution for multiple times to a surface of the base substrate on which a photoresist is formed.

In some embodiments, the developing solution is replenished for 3 to 5 times.

In some embodiments, the developing solution is replenished for 2 to 3 times to the surface of the base substrate on which the photoresist is formed before the development is performed halfway.

In some embodiments, the display substrate includes a display area and a peripheral area arranged around the display area, the peripheral area includes an arc-shaped corner area close to an edge portion of the display area, the arc-shaped corner area is provided with a first signal line, the first signal line includes a first straight-line portion, a second straight-line portion, and a first arc-shaped portion connecting the first straight-line portion and the second straight-line portion. The mask plate includes a first mask pattern for manufacturing the first arc-shaped portion, a radius of curvature of an inner boundary of the first mask pattern is 3.5 um to 4.5 um, and a radius of curvature of an outer boundary of the first mask pattern is 6 um to 8 um.

Embodiments of the present disclosure also provide a display substrate manufactured by the above method for manufacturing the display substrate.

In some embodiments, the display substrate includes a display area and a peripheral area arranged around the display area, the peripheral area includes an arc-shaped corner area close to an edge portion of the display area, the arc-shaped corner area is provided with a first signal line, the first signal line includes a first straight-line portion, a second straight-line portion, and a first arc-shaped portion connecting the first straight-line portion and the second straight-line portion; the mask plate includes a first mask pattern for manufacturing the first arc-shaped portion, a radius of curvature of an inner boundary of the first mask pattern is 3.5 um to 4.5 um, and a radius of curvature of an outer boundary of the first mask pattern is 6 um to 8 um.

In some embodiments, the first straight-line portion includes a first portion close to the first arc-shaped portion and a second portion at a side of the first portion away from the first arc-shaped portion, and a line width of the first portion is approximately equal to that of the second portion.

In some embodiments, the display substrate further includes a set of dummy lines located between two adjacent first signal lines, each set of dummy lines includes at least two dummy lines parallel to each other, and an extension direction of the dummy lines is the same as or approximately the same as an extension direction of the first straight-line portion; a minimum distance between the first arc-shaped portion and the dummy line closest to the first arc-shaped portion is 4.5 um to 5.5 um.

In some embodiments, a distance between adjacent dummy lines is 2.0 um to 2.5 um.

In some embodiments, each set of dummy lines includes two dummy lines parallel to each other.

In some embodiments, the peripheral area further includes: a second signal line close to the display area, the second signal line includes: a second arc-shaped portion and a third straight-line portion connected to the second arc-shaped portion; a radius of curvature of an inner boundary of the second arc-shaped portion is 3.5 μm to 4.5 μm, and a radius of curvature of an outer boundary of the second arc-shaped portion is 6 μm to 8 μm.

In some embodiments, the peripheral area further includes: the second signal line close to the display area, the second signal line including the second arc-shaped portion and the third straight-line portion connected to the second arc-shaped portion; a plurality of third signal lines parallel to the third straight-line portion, the third signal lines being located on a side of the third straight-line portion away from the display area. A line width of the third signal line is approximately equal to that of the third straight-line portion.

Embodiments of the present disclosure also provide a display device including the above display substrate.

Embodiments of the present disclosure have the following beneficial effects.

In the above solution, the step of baking the photoresist pattern is omitted, a slope angle of the edge of the photoresist pattern formed in this way is relatively small, and the slope angle of the signal line obtained after etching the metal layer by using the photoresist pattern as a mask is also relatively small. Thus, the morphology of an insulating layer covered on the signal line can be optimized, which is advantageous for realizing a narrow frame of a display product.

REFERENCE NUMERALS

Figures 1, 2:
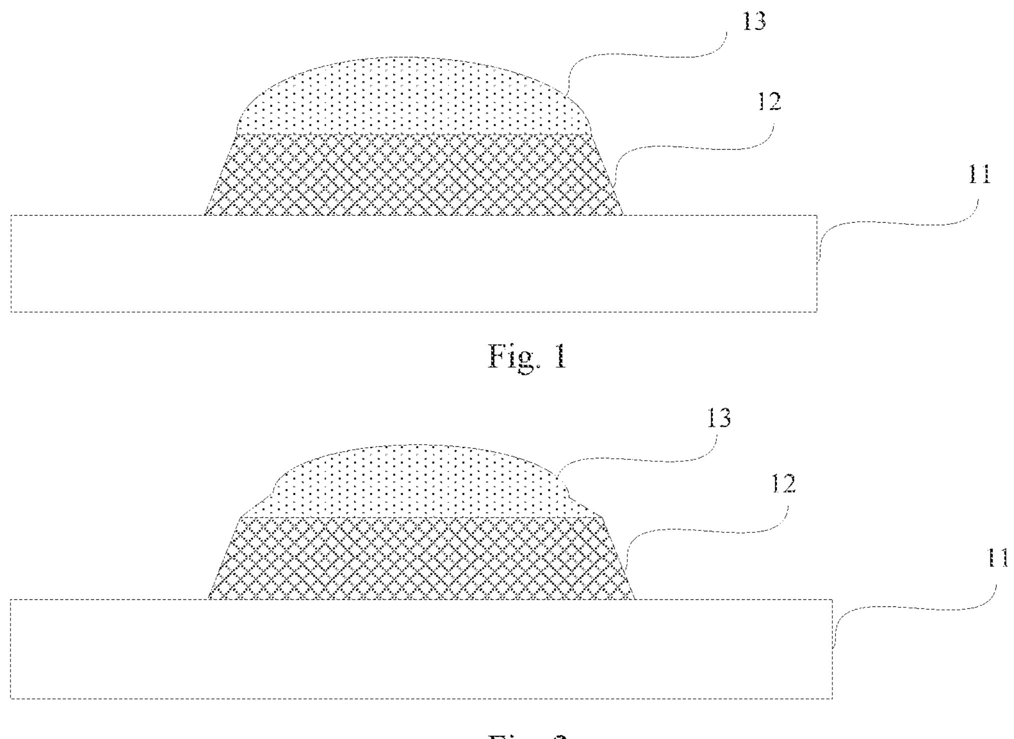
FIG. 1 is a schematic diagram of manufactured signal lines in the related art.
FIG. 2 is a schematic diagram of manufactured signal lines according to an embodiment of the present disclosure.

11: base substrate
12: metal layer
13: photoresist layer
01: first mask pattern
02: second mask pattern
03: third mask pattern
04: fourth mask pattern
05: fifth mask pattern
06: sixth mask pattern
07: seventh mask pattern
08: dummy mask pattern
09: mask pattern
21: first arc-shaped portion
22: first portion
23: second portion
24: second straight-line portion
25: second arc-shaped portion
26: third straight-line portion
27: third signal line
28: dummy line
29: signal line

DETAILED DESCRIPTION

In order to clarify the to-be-solved technical problems, technical solutions, and advantages of the embodiments of the present disclosure, a detailed description will be given below with reference to the drawings and specific embodiments.

Embodiments of the present disclosure provide a display substrate, a method for manufacturing same, and a display device, which can realize a narrow frame of a display product.

An embodiment of the present disclosure provides a method for manufacturing a display substrate, including:

forming a metal layer on a base substrate;
forming a photoresist layer on the metal layer;
exposing the photoresist layer by using a mask plate;
developing the exposed photoresist layer to form a photoresist pattern; and
omitting a step of baking the photoresist pattern, and etching the metal layer by using the photoresist pattern as a mask to form a signal line.

The above metal layer may be a gate metal layer of the display substrate, and may also be a source and drain metal layer of the display substrate, and the above etching includes dry etching and wet etching.

In the embodiment, the step of baking the photoresist pattern is omitted, the photoresist pattern formed in this way has a relatively small slope angle in its edge, and the slope angle of the signal line obtained after etching the metal layer by using the photoresist pattern as a mask is also relatively small, so that the morphology of an insulating layer covered on the signal line can be optimized, which is advantageous for realizing a narrow frame of a display product.

In the related art, a metal layer 12 is formed on a base substrate 11; a photoresist layer is formed on the metal layer 12, the photoresist layer 13 is exposed using a mask plate, the exposed photoresist layer is developed to form a photoresist pattern, and then the photoresist pattern is baked. As shown in FIG. 1, the edge of the baked photoresist pattern has a larger slope angle, and the metal layer 12 is etched by using the photoresist pattern as a mask, so that the formed signal line also has a larger slope angle, thus resulting in poor morphology of the insulating layer covering the signal line. For example, the metal layer 12 is the gate metal layer, after the pattern of the gate metal layer is formed, an intermediate insulating layer covering the pattern of the gate metal layer will be formed, and then the pattern of the source and drain metal layer will be formed on the intermediate insulating layer. If the slope angle of the pattern of the gate metal layer is too large, the coverage of the intermediate insulating layer will be poor, and the surface of the intermediate insulating layer is uneven, thereby causes a source and drain metal layer to be remained after the source and drain metal layer is etched, and the remained source and drain metal layer will causes adjacent signal lines (made by the source and drain metal layer) to be connected. In order to prevent the remained source and drain metal layer from being conducting adjacent signal lines, it is necessary to design the spacing between adjacent signal lines to be relatively large, which is not conducive to realizing a narrow frame of a display product.

In the embodiments, the step of baking the photoresist pattern is omitted, the slope angle of the edge of the photoresist pattern formed in this way (i.e., the angle between the side surface of the edge of the photoresist pattern and the plane where the base substrate is located) is relatively small, and the slope angle of the signal line (made of the gate metal layer) obtained after etching the gate metal layer by using the photoresist pattern as a mask is also relatively small, so that the morphology of the intermediate insulating layer covered on the signal line can be optimized. As such, the surface of the intermediate insulating layer is relatively flat, and the remaining of the source and drain metal layer on the surface of the intermediate insulating layer is avoided, which is advantageous for realizing a narrow frame of a display product.

In a specific example, after the photoresist pattern is baked, then the photoresist pattern is used as a mask, and the average value of the slope angle of the signal line (i.e., the angle between the side surface of the edge of the signal line and the plane where the base substrate is located) obtained after the gate metal layer is etched is 57.8 degrees. In the case that other process parameters are unchanged, the step of baking the photoresist pattern is omitted, and after the photoresist pattern is used as a mask, the slope angle of the signal line obtained after the gate metal layer is etched is 36.9 to 53.7 degrees, with the average value being 46.2 degrees. It can be seen that the technical solution of the embodiments enables to greatly reduce the slope angle of the signal line.

In the embodiments, when the metal layer is etched, the metal layer can be wet etched first, and then the metal layer is dry etched. After the metal layer is wet etched, the slope angle of the formed signal line is relatively large, and therefore, the morphology of the signal line can be subsequently modified by the dry etching so as to reduce the slope angle of the signal line.

In the related art, the bias of the critical dimension (CD) of a signal line is relatively large, and this causes the value of the final inspection critical dimension (FICD) to be relatively small, i.e., the sum of the line width and the line spacing of the signal line is relatively small, so that the signal line is too thin and the defect of broken line will be caused. In this regard, a relatively large frame design of a display product is required to improve the FICD, which is not conducive to realizing a narrow frame of a display product. Therefore, CD Bias needs to be optimized and FICD needs to be improved to realize a narrow frame of a display product.

The CD Bias is formed because the photoresist ashing speed is too fast and the metal layer covered by the photoresist is etched due to the over-etching. The photoresist is in a shape of high molecular chain, small molecules are formed by plasma bombardment, and are ashed in an oxygen atmosphere. In the embodiments, the ashing speed of the photoresist can be reduced by reducing the bias power and oxygen in the ashing process, so as to reduce the over-etching, thereby reducing the CD Bias.

In some embodiments, after forming the signal line, the method further includes ashing the photoresist with the bias power of 3500-6000 W. In the related art, the bias power used for ashing the photoresist is about 8000 W. In the embodiment, the bias power used for ashing the photoresist is reduced to 3500-6000 W, which can reduce the ashing speed of the photoresist, thereby reducing the CD Bias and improving the FICD of the signal line, and being beneficial for realizing a narrow frame of a display product.

In some embodiments, an etching gas used for ashing the photoresist is oxygen gas with a gas flow rate of 800-1000 sccm. In the related art, the flow rate of the oxygen gas when ashing the photoresist is about 1350 sccm. In the embodiment, the flow rate of the oxygen gas when ashing the photoresist is reduced to 800-1000 sccm, which can reduce the ashing speed of the photoresist, thereby reducing the CD Bias and improving the FICD of the signal line, and being advantageous for realizing a narrow frame of a display product.

Through experiments, after the bias power used for ashing the photoresist is reduced to 3500-6000 W, and the oxygen gas flow rate during ashing the photoresist is reduced to 800-1000 sccm, the CD Bias can be reduced by about 0.1 um, thereby improving the FICD of signal lines, which is beneficial to realizing a narrow frame of a display product.

In the embodiment, an example is given that the photoresist is ashed by using oxygen is exemplified, but it is not limited to using oxygen to ash the photoresist, and other gases may be used.

Figure 3:
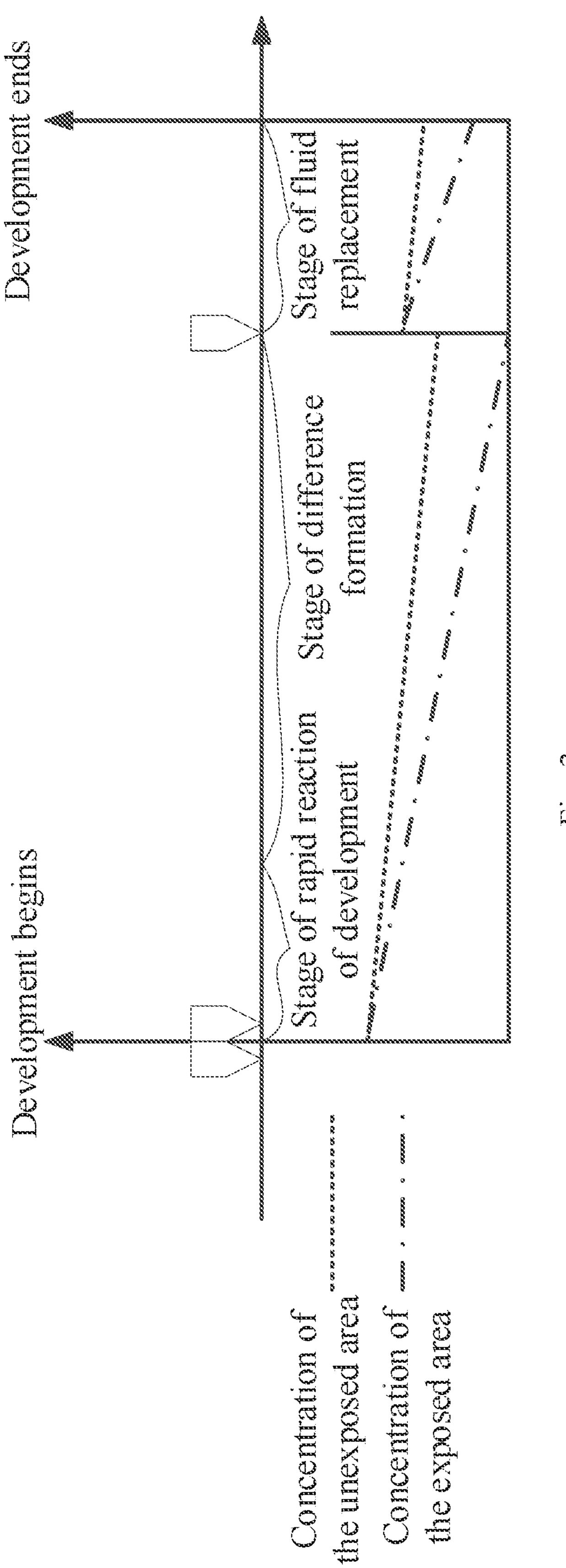
FIG. 3 and FIG. 4 are schematic diagrams of a concentration of a developing solution during the development according to an embodiment of the present disclosure.

In the related art, a positive photoresist is taken as an example, after the photoresist is exposed by using a mask plate, an exposed area, and an unexposed area are formed, and then the photoresist is developed with a developing solution. As shown in FIG. 3, in the initial stage of development, the concentrations of the developing solutions in the two areas of the display substrate are the same, and after a period of development, since the photoresist in the exposed area reacts with the developing solution, the concentration of the developing solution in the exposed area will decrease, and there will be a difference in the concentrations of the developing solutions in the exposed area and the unexposed area. In particular, for the display product with a narrow frame, the distance between signal lines is relatively small, which will aggravate the difference in the concentrations of the developing solutions in the exposed area and the unexposed area, thus leading to a significant difference in CD, and finally causing a poor display product.

Figure 4:
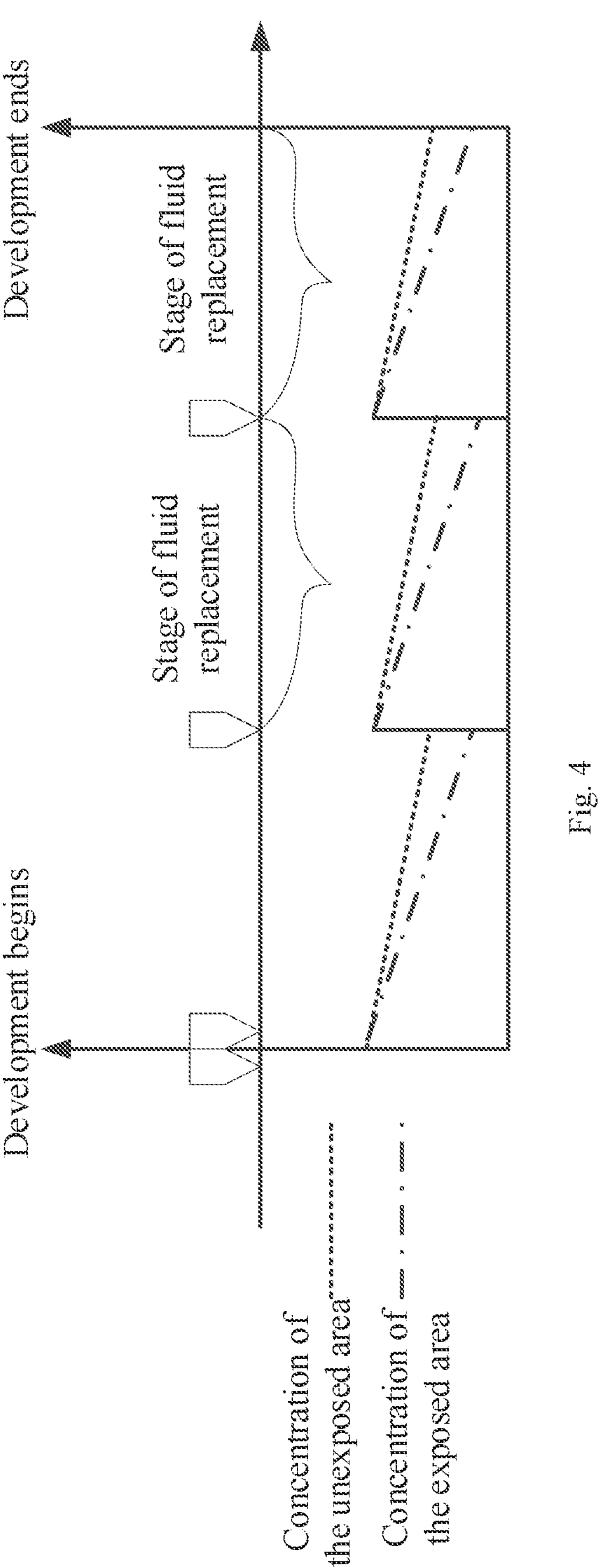

In order to improve the yield of the display product, it is necessary to reduce the difference in the concentrations of the developing solutions between the exposed area and the unexposed area and to replenish the developing solution for several times onto the surface of the base substrate on which the photoresist is formed during the development. As shown in FIG. 4, before the end of development, the developing solution can be replenished twice onto the surface of the base substrate on which the photoresist is formed by using a developing solution sprayer, so that the difference in the concentrations of the developing solutions between the exposed area and the unexposed area can be reduced, the difference in CD can be reduced, the uniformity of CD can be improved, and a narrow frame of a display product can be realized. Of course, the embodiment is not limited to replenishing the developing solution twice to the surface of the base substrate on which the photoresist is formed during the development, and in some embodiments, the developing solution is replenished for 3 to 5 times.

In addition, since the change in the concentration of the developing solution is relatively large in the first half process of the development, the developing solution can be replenished for 2 to 3 times to the surface of the base substrate on which the photoresist is formed before the development has been performed in half, which can effectively reduce the difference in the concentrations of the developing solutions between the exposed area and the unexposed area, reduce the difference in CD, improve the uniformity of CD, and facilitate realizing a narrow frame of a display product.

From the viewpoint of reducing the difference in the concentrations of the developing solutions between the exposed area and the unexposed area, during the development, the more times that the developing solution is replenished is better, but it also brings about an increase in cost, and therefore, by balancing the two aspects, the developing solution can be replenished for 2 to 3 times onto the surface of the base substrate on which the photoresist is formed in the first half process of the development, and the developing solution can be replenished for 1 to 2 times to the surface of the base substrate on which the photoresist is formed in the last half process of the development. It can minimize the difference in the concentrations of the developing solutions between the exposed area and the unexposed area, and can also control the cost of manufacturing the display substrate.

Figure 5:
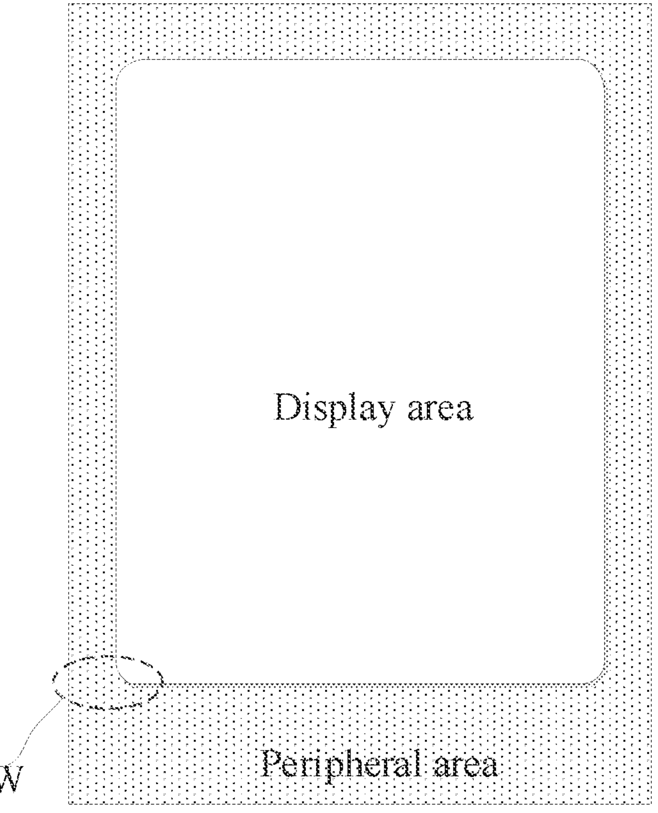
FIG. 5 is a schematic plan diagram of a display substrate.

As shown in FIG. 5, the display substrate includes a display area and a peripheral area arranged around the display area, and in order to reduce the pitch of a signal line in the peripheral area (i.e., the sum of the line width and the line spacing of the signal lines) and achieve a narrow frame of the display product, a mask plate for manufacturing the signal lines in the peripheral area needs to be designed.

In some embodiments, the peripheral area includes an arc-shaped corner area W close to an edge portion of the display area, the arc-shaped corner area is provided with a first signal line including a first straight-line portion, a second straight-line portion, and a first arc-shaped portion connecting the first straight-line portion and the second straight-line portion.

Figure 6:
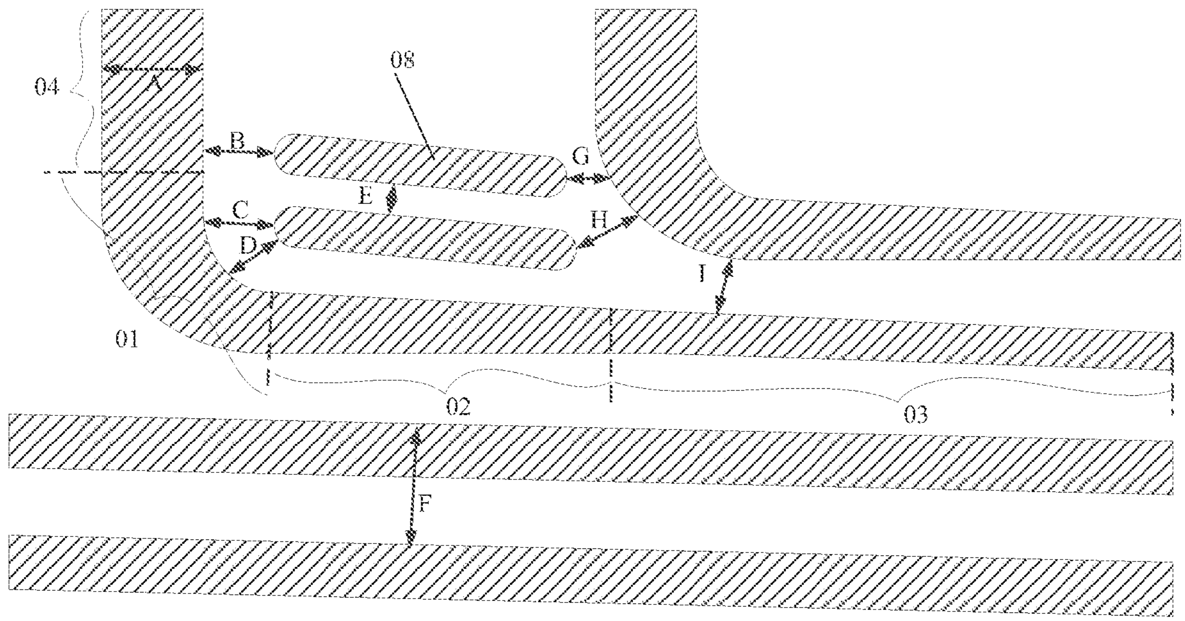
FIGS. 6 to 8 are schematic diagrams of a mask plate used in embodiments of the present disclosure.

As shown in FIG. 6, the mask plate for manufacturing the signal lines of the peripheral area includes a first mask pattern 01 for manufacturing the first arc-shaped portion, the radius of curvature of an inner boundary of the first mask pattern 01 is 3.5 um to 4.5 um, and the radius of curvature of an outer boundary of the first mask pattern 01 is 6 um to 8 um.

If the radius of curvature of the outer boundary of the first mask pattern 01 is too small, metal tends to be remained between the arc-shaped portion of the first signal line and the adjacent signal line. If the radius of curvature of the outer boundary of the first mask pattern 01 is too large, it is easy to cause the distance between the arc-shaped portion of the first signal line and the adjacent signal line to be too large, and the signal line in the peripheral area needs to occupy a relatively large area, which is disadvantageous for realizing a narrow frame of a display product. Therefore, in the embodiment, the radius of curvature of the inner boundary of the first mask pattern 01 is designed to be 3.5 um to 4.5 um, and the radius of curvature of the outer boundary of the first mask pattern 01 is designed to be 6 um to 8 um, which can not only ensure that metal residue does not easily occur between the arc-shaped portion of the first signal line and the adjacent signal line, but also avoid that the signal line in the peripheral area occupies a relatively large area, which is beneficial to realizing a narrow frame of a display product.

In a specific example, the radius of curvature of the inner boundary of the first mask pattern 01 may be 4 um, and the radius of curvature of the outer boundary of the first mask pattern 01 may be 6 um.

In some embodiments, the first straight-line portion includes a first portion close to the first arc-shaped portion and a second portion on a side of the first portion away from the first arc-shaped portion. As shown in FIG. 6, the mask plate includes a second mask pattern 02 for manufacturing the first portion and a third mask pattern 03 for manufacturing the second portion.

The display substrate further includes a set of dummy lines located between two adjacent first signal lines, where each set of dummy lines includes at least two dummy lines parallel to each other, and the extension direction of the dummy line is the same as or approximately the same as the extension direction of the first straight-line portion.

As shown in FIG. 6, the mask plate includes a dummy mask pattern 08 for manufacturing the dummy lines and a fourth mask pattern 04 for manufacturing the second straight-line portion, and the extension direction of the dummy mask pattern 08 is the same or approximately the same as that of the second mask pattern 02.

If the line widths of the second mask pattern 02 and the third mask pattern 03 are equal, since the distance between the second mask pattern 02 and the dummy mask pattern 08 is relatively close, after the photoresist is exposed and developed by using the mask plate and after the metal layer is etched by using the photoresist pattern as a mask to form a signal line, the line width of the first portion is likely to be smaller than that of the second portion. Therefore, the second mask pattern 02 and the third mask pattern 03 need to be designed to compensate for the line width of the first portion.

In some embodiments, the line width of the second mask pattern 02 is greater than that of the third mask pattern 03 by 0.08-0.12 um, which ensures that the line width of the formed first portion is approximately equal to the line width of the formed second portion. If the line width of the second mask pattern is greater than that of the third mask pattern, for example, being greater than 0.2 um or 0.3 um, the metal layer will be remained between the first portion and the dummy line. If the line width of the second mask pattern is greater than that of the third mask pattern, for example, being greater than 0.01 um, the compensation effect is not achieved and the line width of the first portion is still relatively small and there is a risk of a broken line. In a specific example, the line width of the second mask pattern 02 may be greater than that of the third mask pattern 03 by 0.1 um.

In some embodiments, in order to reduce the distance between the dummy line and the first signal line and thereby to reduce the area of the peripheral area, the size and position of the dummy mask pattern may be designed, the dummy mask pattern is extended, and the distance between the dummy mask pattern and the first mask pattern, and the distance between the dummy mask pattern and the fourth mask pattern are reduced, and the minimum distance D between the first mask pattern and a dummy mask pattern closest to the first mask pattern may be 2.0 um to 2.5 um; the minimum distance B or C between the dummy mask pattern and the fourth mask pattern may be 2.0 um to 2.5 um.

In a specific example, the minimum distance between the dummy mask pattern closest to the first mask pattern and the first mask pattern is 2.5 um, and the minimum distance between the dummy mask pattern and the fourth mask pattern is 2.5 um, so that after using a mask plate to make a signal line, the minimum distance between the dummy line closest to the first arc-shaped portion and the first arc-shaped portion is 4.5-5.5 um, and the spacing between the dummy line and the first signal line can be reduced, thereby reducing the area of the peripheral area, which is advantageous for realizing a narrow frame of a display product.

In some embodiments, each set of dummy lines includes two dummy lines parallel to each other. Accordingly, as shown in FIG. 6, each set of dummy mask patterns includes two dummy mask patterns parallel to each other, and in order to reduce the area occupied by the dummy mask patterns, the distance between adjacent the dummy mask patterns cannot be too large. In addition, in order to prevent the metal layer from being remaining between the dummy lines, the distance E between adjacent dummy mask patterns cannot be too small, and in the embodiment, the distance E between adjacent dummy mask patterns may be designed to be 2.0 um to 2.5 um, which can both reduce the area occupied by the dummy mask patterns and avoid the residual metal layer between the dummy lines.

In a specific example, as shown in FIG. 6, the line width A of the fourth mask pattern 04 may be 3.5 um; the minimum distance B or C between the dummy mask pattern 08 and the fourth mask pattern 04 may be 4.0 um; the minimum distance D between the dummy mask pattern 08 and the first mask pattern 01 may be greater than 2.4 um; the minimum distance G between the dummy mask pattern 08 and another first mask pattern 01 may be 2.3 um; the minimum distance H between another dummy mask pattern 08 and another first mask pattern 01 may be 2.0 um; and the minimum distance I between the third mask pattern 03 and another first mask pattern 01 may be 2.2 um.

The display substrate further includes a line parallel to the first straight-line portion, and a pitch F of a mask pattern for manufacturing this line may be 1.8-2.0 um.

In some embodiments, the peripheral area further includes: a second signal line close to the display area. The second signal line including: a second arc-shaped portion and a third straight-line portion connected to the second arc-shaped portion; a plurality of the third signal lines parallel to the third straight-line portion, the third signal lines being located on a side of the third straight-line portion away from the display area.

Figure 7:
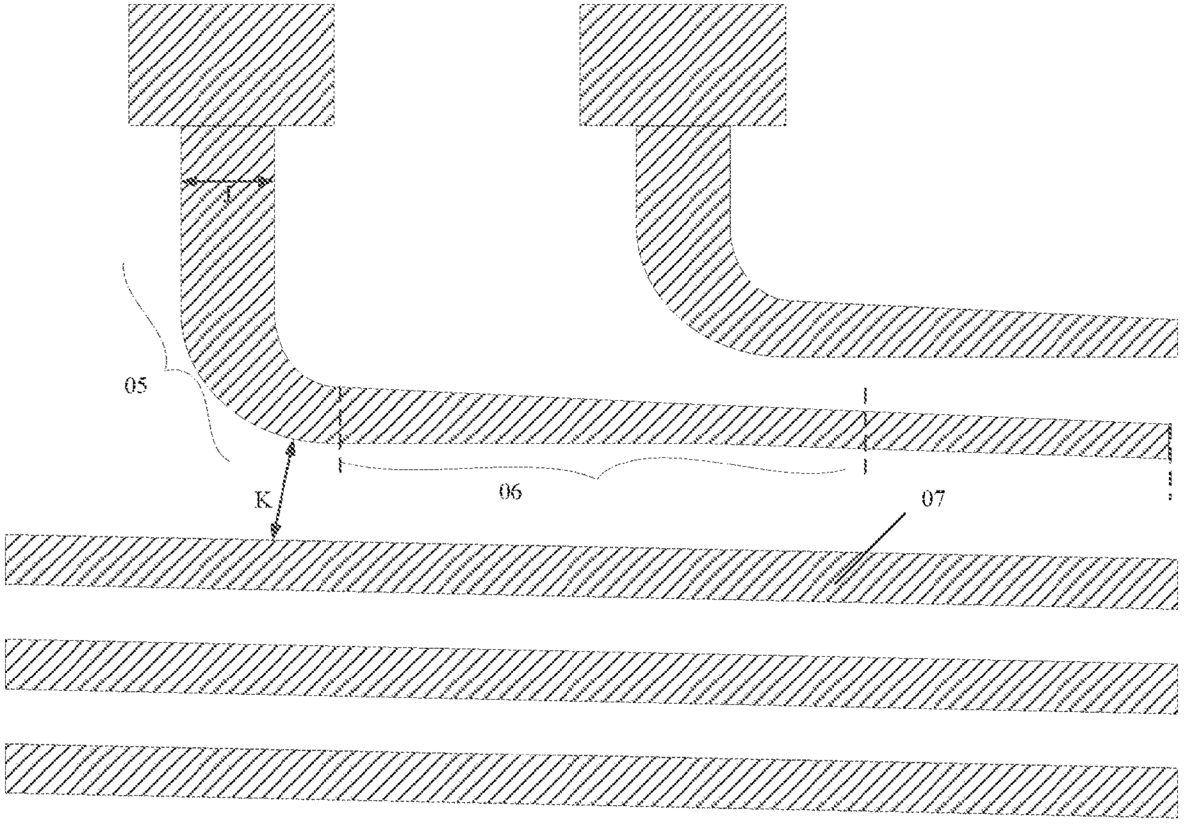

As shown in FIG. 7, the mask plate includes a fifth mask pattern 05 for manufacturing the second arc-shaped portion, a sixth mask pattern 06 for manufacturing the third straight-line portion, and a seventh mask pattern 07 for manufacturing the third signal line.

If the radius of curvature of the outer boundary of the fifth mask pattern 05 is too small, metal residue easily occurs between the arc-shaped portion of the second signal line and the adjacent signal line. If the radius of curvature of the outer boundary of the fifth mask pattern 05 is too large, it is easy to cause the distance between the arc-shaped portion of the second signal line and the adjacent signal line to be too large, and the signal line in the peripheral area needs to occupy a relatively large area, which is disadvantageous for realizing a narrow frame of a display product. Therefore, in the embodiments, the radius of curvature of the inner boundary of the fifth mask pattern 05 is designed to be 3.5 um to 4.5 um, and the radius of curvature of the outer boundary of the fifth mask pattern 05 is designed to be 6 um to 8 um, which can not only ensure that metal residue does not easily occur between the arc-shaped portion of the second signal line and the adjacent signal line, but also avoid that the signal line in the peripheral area occupies a relatively large area, which is beneficial to realizing a narrow frame of a display product.

In a specific example, the radius of curvature of the inner boundary of the fifth mask pattern 05 may be 4 um and the radius of curvature of the outer boundary of the fifth mask pattern 05 may be 6 um.

In some embodiments, the line width of the sixth mask pattern 06 is greater than the line width of the seventh mask pattern 07 by 0.18-0.22 um, which ensures that the line width of the formed third straight-line portion is approximately equal to the line width of the third signal line. If the line width of the sixth mask pattern 06 is greater than that of the seventh mask pattern 07, for example, being greater than 0.2 um or 0.3 um, the metal layer will be remained between the line width of the third straight-line portion and the third signal line. If the line width of the sixth mask pattern 06 is greater than that of the seventh mask pattern 07, for example, being greater than 0.01 um, the compensation effect is not achieved and the line width of the third straight-line portion will still be relatively small and there is a risk of a broken line. In a specific example, the line width of the sixth mask pattern 06 may be greater than that of the seventh mask pattern 07 by 0.2 um.

In a specific example, as shown in FIG. 7, the line width J of the fifth mask pattern 05 may be 3.5 um, and the minimum distance K between the fifth mask pattern 05 and the seventh mask pattern 07 may be 2.2 um.

Figure 8:
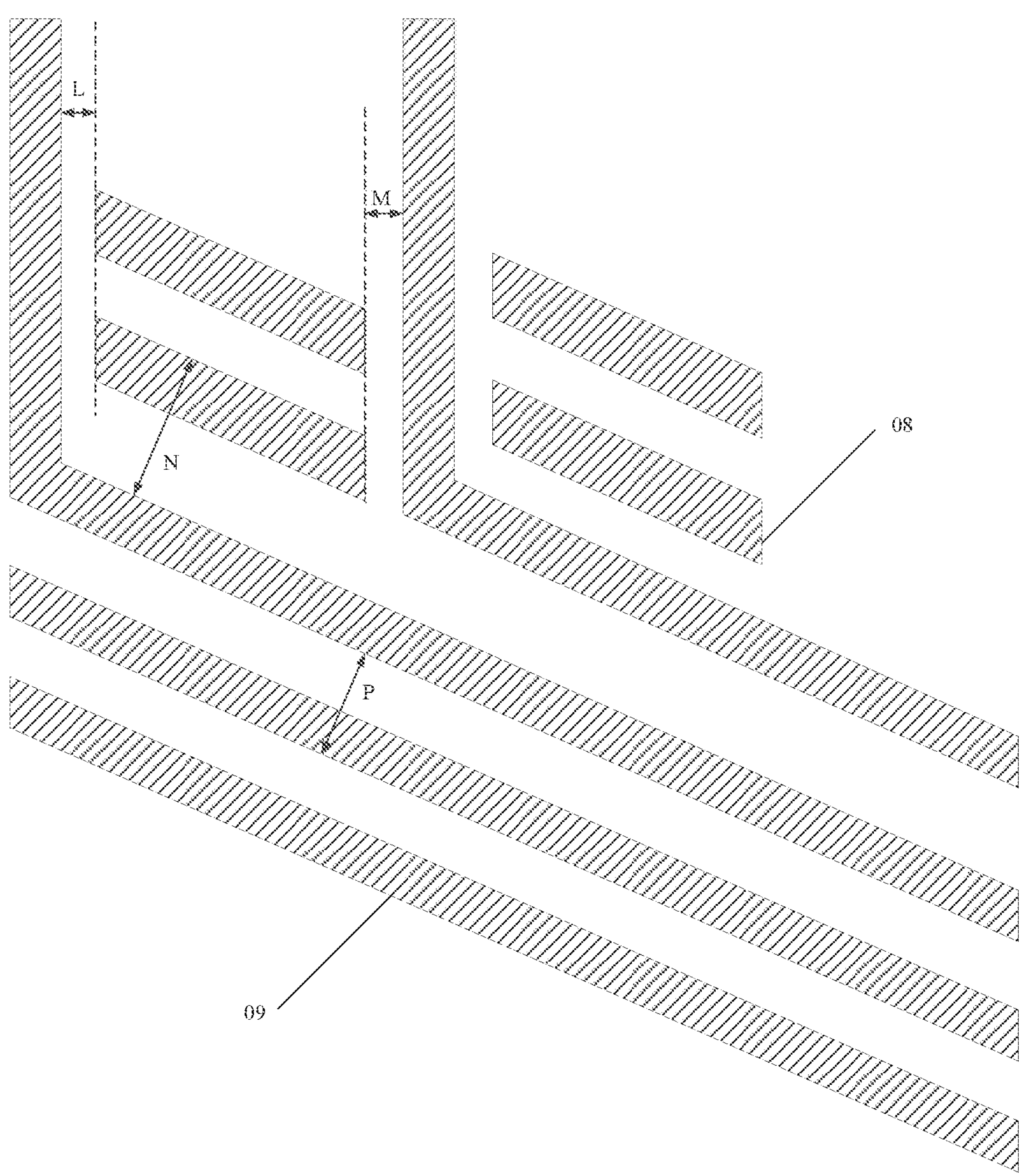

The display substrate further includes a punch region, the punch region is a region for placing a photosensitive device, a signal line is arranged around the punch region, and the mask plate further includes a mask pattern 09 for manufacturing the signal line around the punch region. In a specific example, as shown in FIG. 8, in order to shorten the pitch of the signal line of the punch region, the minimum distances L and M between the dummy mask pattern 08 and adjacent mask patterns 09 may be 3.0 um, the pitch N of the dummy line may be 2.4-3.3 um, and the pitch P of the mask pattern 09 corresponding to the signal line may be 2.3-3.3 um. The blank region at the outermost signal line is larger, and the line width of the outermost signal line is thinner when exposed and developed. Therefore, the line width of the outermost signal line needs to be compensated, and the line width of the outermost mask pattern 09 corresponding to the outermost signal line can be increased, so that the line width of the part of the mask patterns 09 is increased by 0.18-0.22 um as compared with that of other mask patterns, for example, the line width may be 0.2 um.

In the related art, when manufacturing a display product of narrow frame, it is necessary to form a pattern of the gate metal layer by two patterning processes, including: using a wet etching+dry etching process to form the gate metal layer pattern of the display area through one patterning process. In addition, since the area of the peripheral area is relatively small and the requirement on the accuracy is high, a dry etching process with a smaller etching bias is used to form the gate metal layer pattern of the peripheral area through another patterning process, thus increasing the time and the cost for manufacturing the display substrate. In the embodiment, by designing the mask plate and replenishing the developing solution during the development, the etching bias of the wet etching+dry etching process can be reduced, so that the pattern of the gate metal layer of the display area and the peripheral area can be formed by one patterning process, i.e., the pattern of the gate metal layer of the display area and the peripheral area is formed by one patterning process using the wet etching+dry etching process, thus reducing the time and the cost for manufacturing the display substrate.

When the pattern of the gate metal layer of the display area and the peripheral area is formed by one patterning process using a wet etching+dry etching process, a layer of photoresist is coated on the gate metal layer, the photoresist pattern is formed after the photoresist is exposed and developed, and the pattern of the gate metal layer is initially formed by etching the gate metal layer by using the photoresist pattern as a mask, but the slope angle of the pattern edge of the gate metal layer formed at this moment is relatively large. Therefore, the pattern of the gate metal layer is subsequently trimmed by dry etching to reduce the slope angle of the pattern edge of the gate metal layer. Meanwhile, the pattern of an active layer formed on the display substrate can also be doped by dry etching to improve the conductivity of the active layer.

Embodiments of the present disclosure also provide a display substrate manufactured by the above method for manufacturing the display substrate.

In the embodiment, the step of baking the photoresist pattern is omitted during the manufacturing process of the display substrate, the slope angle of the edge of the photoresist pattern formed in this way is relatively small, and the slope angle of the signal line (made of the gate metal layer) obtained after etching the gate metal layer by using the photoresist pattern as a mask is also relatively small, so that the morphology of the intermediate insulating layer covered on the signal line can be optimized, so that the surface of the intermediate insulating layer is relatively flat, and the residue of the source and drain metal layer on the surface of the intermediate insulating layer is avoided, which is advantageous for realizing a narrow frame of a display product.

In a specific example, after the photoresist pattern is baked, then the photoresist pattern is used as a mask, and the average value of the slope angle of the signal line obtained after the gate metal layer is etched is 57.8 degrees. In the case that other process parameters are unchanged, the step of baking the photoresist pattern is omitted, and after the photoresist pattern is used as a mask, the slope angle of the signal line obtained after the gate metal layer is etched is 36.9 to 53.7 degrees, with the average value being 46.2 degrees. It can be seen that the technical solution of this embodiment enables to greatly reduce the slope angle of the signal lines.

In the embodiment, when the metal layer is etched, the metal layer can be wet etched first, and then the metal layer is dry etched. After the metal layer is wet etched, the slope angle of the formed signal line is relatively large, and therefore, the morphology of the signal line can be subsequently modified by the dry etching so as to reduce the slope angle of the signal line.

In some embodiments, as shown in FIG. 5, the display substrate includes the display area and the peripheral area arranged around the display area, the peripheral area includes an arc-shaped corner area W close to an edge portion of the display area, the arc-shaped corner area is provided with a first signal line including a first straight-line portion, a second straight-line portion, and a first arc-shaped portion connecting the first straight-line portion and the second straight-line portion.

Figure 9:
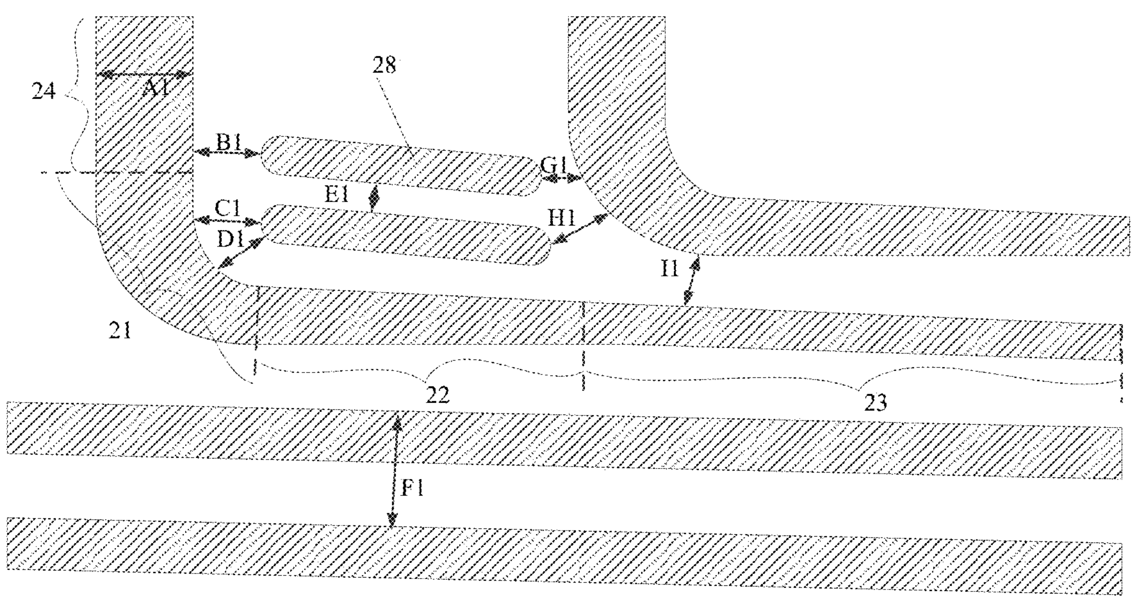
FIGS. 9 to 11 are schematic diagrams of a display substrate according to embodiments of the present disclosure.

In some embodiments, as shown in FIG. 9, the peripheral area includes an arc-shaped corner area close to an edge portion of the display area, the arc-shaped corner area is provided with a first signal line including a first straight-line portion, a second straight-line portion, and a first arc-shaped portion 21 connecting the first straight-line portion and the second straight-line portion.

As shown in FIG. 6, the mask plate for manufacturing the signal lines of the peripheral area includes a first mask pattern 01 for manufacturing the first arc-shaped portion, the radius of curvature of the inner boundary of the first mask pattern 01 is 3.5 um to 4.5 um, and the radius of curvature of the outer boundary of the first mask pattern 01 is 6 um to 8 um.

If the radius of curvature of the outer boundary of the first mask pattern 01 is too small, metal residue tends to occur between the arc-shaped portion of the first signal line and the adjacent signal line. If the radius of curvature of the outer boundary of the first mask pattern 01 is too large, it is easy to cause the distance between the arc-shaped portion of the first signal line and the adjacent signal line to be too large, and the signal line in the peripheral area needs to occupy a relatively large area, which is disadvantageous for realizing a narrow frame of a display product. Therefore, in the embodiment, the radius of curvature of the inner boundary of the first mask pattern 01 is designed to be 3.5 um to 4.5 um, and the radius of curvature of the outer boundary of the first mask pattern 01 is designed to be 6 um to 8 um, which can not only ensure that metal residue does not easily occur between the arc-shaped portion of the first signal line and the adjacent signal line, but also avoid that the signal line in the peripheral area occupies a relatively large area, which is beneficial to realizing a narrow frame of a display product.

In a specific example, the radius of curvature of the inner boundary of the first mask pattern 01 may be 4 um and the radius of curvature of the outer boundary of the first mask pattern 01 may be 6 um. After manufacturing the first signal line using the mask plate, as shown in FIG. 9, the radius of curvature of the inner boundary of the first arc-shaped portion 21 is 3.5 um to 4.5 um and the radius of curvature of the outer boundary of the first arc-shaped portion 21 is 6 um to 8 um. Particularly, the radius of curvature of the inner boundary of the first arc-shaped portion 21 may be 4 um and the radius of curvature of the outer boundary of the first arc-shaped portion 21 may be 6 um.

In some embodiments, as shown in FIG. 9, the first straight-line portion includes a first portion 22 close to the first arc-shaped portion and a second portion 23 on a side of the first portion 22 away from the first arc-shaped portion 21. As shown in FIG. 6, the mask plate includes a second mask pattern 02 for manufacturing the first portion and a third mask pattern 03 for manufacturing the second portion.

As shown in FIG. 6, the mask plate includes a dummy mask pattern 08 for manufacturing the dummy lines and a fourth mask pattern 04 for manufacturing the second straight-line portion, and the extension direction of the dummy mask pattern 08 and the second mask pattern 02 is the same or approximately the same.

If the line widths of the second mask pattern 02 and the third mask pattern 03 are equal, since the distance between the second mask pattern 02 and the dummy mask pattern 08 is relatively close, after the photoresist is exposed and developed using the mask plate and after the metal layer is etched by using the photoresist pattern as a mask to form a signal line, the line width of the first portion is likely to be smaller than that of the second portion. Therefore, the second mask pattern 02 and the third mask pattern 03 need to be designed to compensate for the line width of the first portion.

In some embodiments, the line width of the second mask pattern 02 is greater than that of the third mask pattern 03 by 0.08-0.12 um, which ensures that the line width of the formed first portion is approximately equal to the line width of the formed second portion. If the line width of the second mask pattern is greater than that of the third mask pattern, for example, being greater than 0.2 um or 0.3 um, a residual metal layer will be generated between the first portion and the dummy line. If the line width of the second mask pattern is greater than that of the third mask pattern, for example, being greater than 0.01 um, the compensation effect is not achieved and the line width of the first portion is still relatively small and there is a risk of a broken line. In a specific example, the line width of the second mask pattern 02 may be greater than that of the third mask pattern 03 by 0.1 um.

In a specific example, after the photoresist is exposed and developed using the mask plate and the metal layer is etched by using the photoresist pattern as a mask to form a signal line, the line width of the first portion 22 and the second portion 23 on the manufactured display substrate are approximately equal.

In some embodiments, in order to reduce the spacing between the dummy line and the first signal line and thereby reduce the area of the peripheral area, the size and position of the dummy mask pattern may be designed, the dummy mask pattern is extended, and the distance between the dummy mask pattern and the first mask pattern and the fourth mask pattern is reduced, and the minimum distance D between the dummy mask pattern closest to the first mask pattern and the first mask pattern may be 2.0 um to 2.5 um; the minimum distance B or C between the dummy mask pattern and the fourth mask pattern may be 2.0 um to 2.5 um.

In a specific example, after manufacturing the signal line using the mask plate, as shown in FIG. 9, the minimum distance D1 between the dummy line 28 closest to the first arc-shaped portion 21 and the first arc-shaped portion 21 is 4.5-5.5 um, and the spacing between the dummy line 28 and the first signal line can be reduced, thereby reducing the area of the peripheral area, which is advantageous for realizing a narrow frame of a display product.

In some embodiments, as shown in FIG. 9, each set of dummy lines includes two dummy lines 28 parallel to each other. Accordingly, as shown in FIG. 6, each set of dummy mask patterns includes two dummy mask patterns parallel to each other, and in order to reduce the area occupied by the dummy mask patterns, the distance between adjacent the dummy mask patterns cannot be too large. In addition, in order to avoid the residual metal layer between the dummy lines, the distance between adjacent dummy mask patterns cannot be too small, and in the embodiment, the distance between adjacent dummy mask patterns can be designed to be 2.0 um to 2.5 um, which can both reduce the area occupied by the dummy mask patterns and avoid the residual metal layer between the dummy lines.

As shown in FIG. 9, after the photoresist is exposed and developed using the mask plate and the metal layer is etched by using the photoresist pattern as a mask to form a signal line, the distance E1 between adjacent dummy lines 28 on the manufactured display substrate is 2.0 um to 2.5 um.

In a specific example, as shown in FIG. 9, the line width A1 of the second straight-line portion 24 may be 3.5 um; the minimum distance B1 or C1 between the dummy line 28 and the second straight-line portion 24 may be 4.0 um; the minimum distance D1 between the dummy line 28 and the first arc-shaped portion 21 may be greater than 2.4 um; the minimum distance G1 between the dummy line 28 and another first arc-shaped portion 21 may be 2.3 um; the minimum distance H1 between another dummy line 28 and another dummy line 28 may be 2.0 um; and the minimum distance I1 between the second portion 23 and the further dummy line 28 may be 2.2 um.

The display substrate further includes traces parallel to the first straight-line portion, and as shown in FIG. 9, a pitch F1 of these traces may be 1.8-2.0 um.

Figure 10:
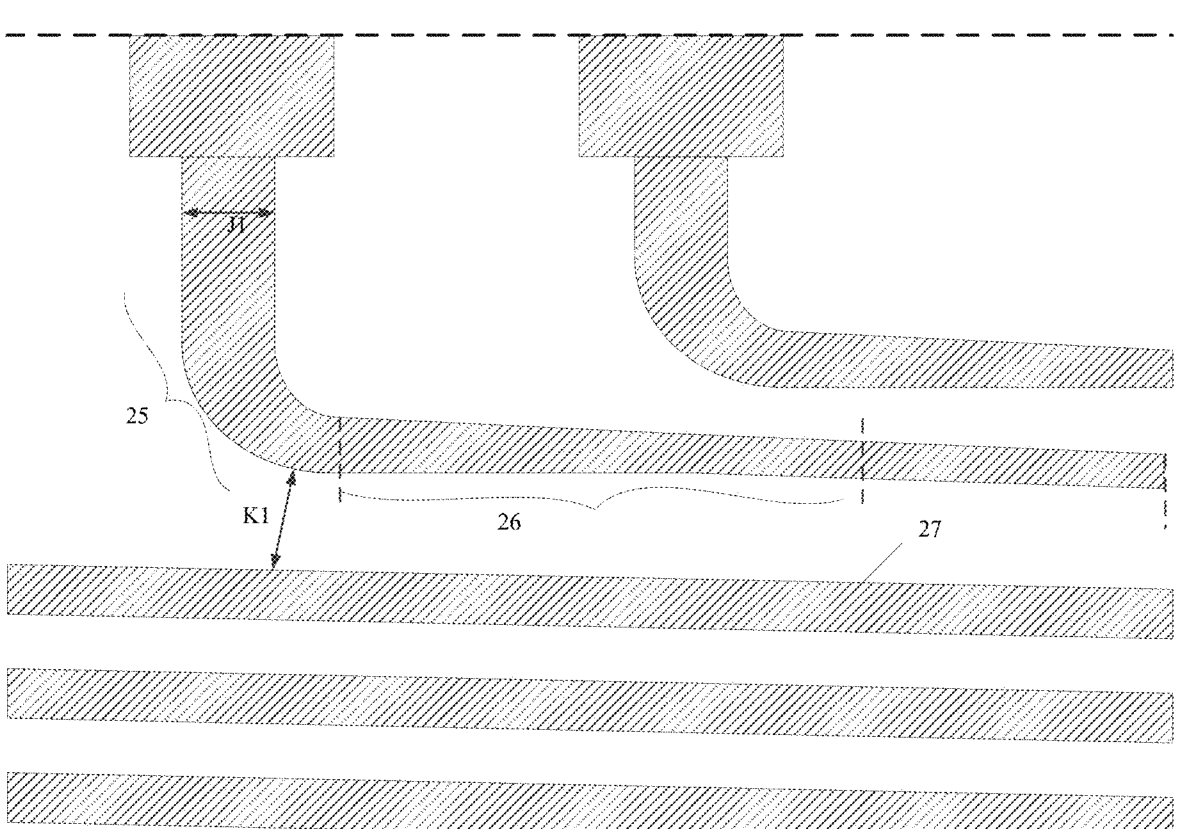

In some embodiments, as shown in FIG. 10, the peripheral area further includes: a second signal line close to the display area, the second signal line including: a second arc-shaped portion 25 and a third straight-line portion 26 connected to the second arc-shaped portion; a plurality of the third signal lines 27 parallel to the third straight-line portion 26, the third signal lines 27 is located on a side of the third straight-line portion 26 away from the display area.

As shown in FIG. 7, the mask plate includes a fifth mask pattern 05 for manufacturing the second arc-shaped portion, a sixth mask pattern 06 for manufacturing the third straight-line portion, and a seventh mask pattern 07 for manufacturing the third signal line.

If the radius of curvature of the outer boundary of the fifth mask pattern 05 is too small, metal residue easily occurs between the arc-shaped portion of the second signal line and the adjacent signal line. If the radius of curvature of the outer boundary of the fifth mask pattern 05 is too large, it is easy to cause the distance between the arc-shaped portion of the second signal line and the adjacent signal line to be too large, and the signal line in the peripheral area needs to occupy a relatively large area, which is disadvantageous for realizing a narrow frame of a display product. Therefore, in the embodiment, the radius of curvature of the inner boundary of the fifth mask pattern 05 is designed to be 3.5 um to 4.5 um, and the radius of curvature of the outer boundary of the fifth mask pattern 05 is designed to be 6 um to 8 um, which can not only ensure that metal residue does not easily occur between the arc-shaped portion of the second signal line and the adjacent signal line, but also avoid that the signal line in the peripheral area occupies a relatively large area, which is beneficial to realizing a narrow frame of a display product.

After the photoresist is exposed and developed using the mask plate and the metal layer is etched by using the photoresist pattern as a mask to form a signal line, the radius of curvature of the inner boundary of the second arc-shaped portion 25 is 3.5 um to 4.5 um and the radius of curvature of the outer boundary of the second arc-shaped portion 25 is 6 um to 8 um on the manufactured display substrate.

In a specific example, the radius of curvature of the inner boundary of the second arc-shaped portion 25 may be 4 um and the radius of curvature of the outer boundary of the second arc-shaped portion 25 may be 6 um.

In some embodiments, the line width of the sixth mask pattern 06 is greater than that of the seventh mask pattern 07 by 0.18-0.22 um, which ensures that the line width of the formed third straight-line portion 26 is approximately equal to the line width of the third signal line 27.

In a specific example, as shown in FIG. 10, the line width J1 of the second arc-shaped portion 25 may be 3.5 um and the minimum distance K1 between the second arc-shaped portion 25 and the third signal line 27 may be 2.2 um.

Figure 11:
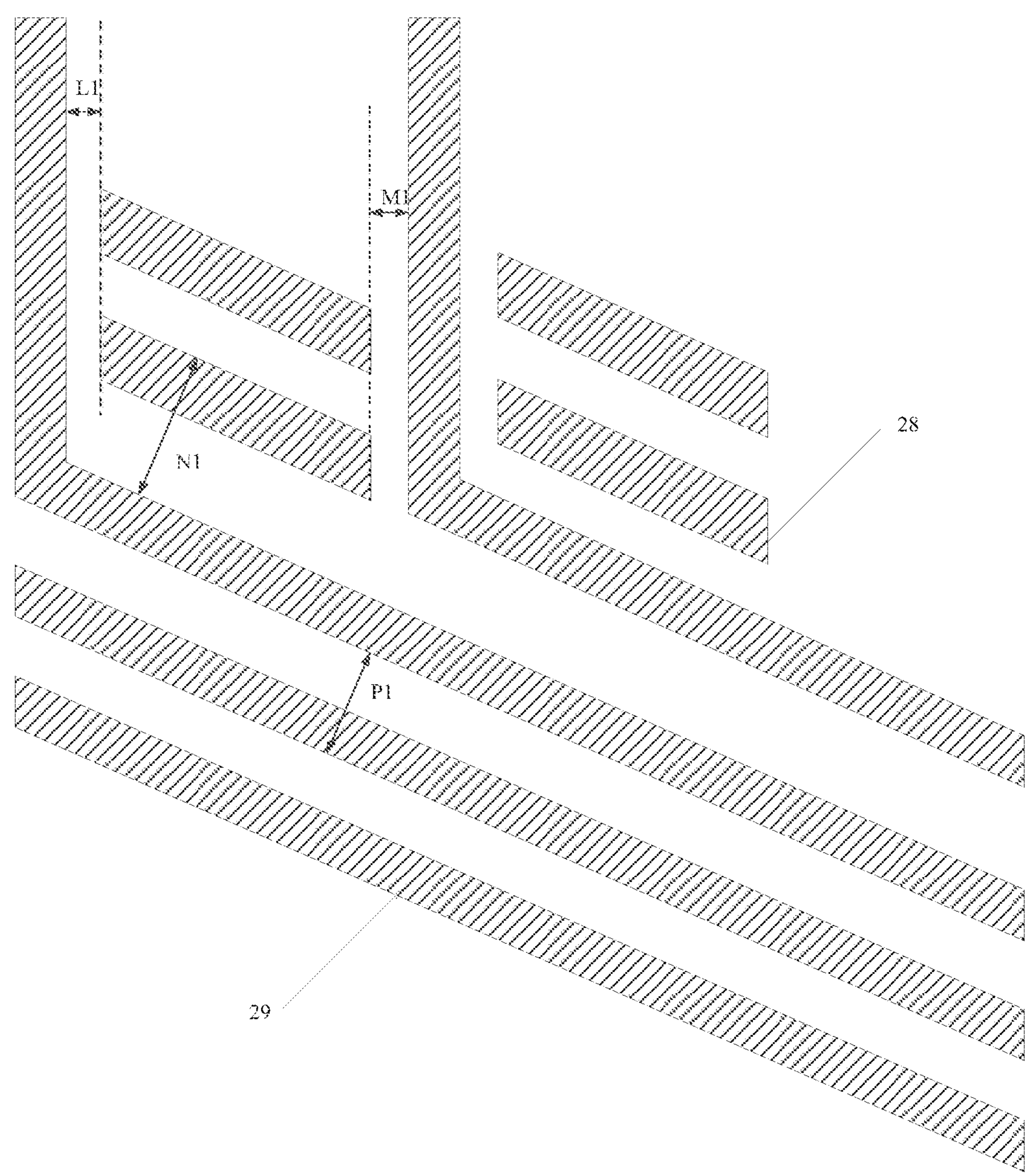

The display substrate further includes a punch region, where the punch region is a region for placing a photosensitive device, a signal line is arranged around the punch region, and the mask plate further includes a mask pattern 09 for manufacturing the signal line around the punch region. In a specific example, as shown in FIG. 11, in order to compress the pitch of the signal line of the punch region, the minimum distances L1 and M1 between the dummy line 28 and an adjacent signal line 29 may be 3.0 um, the pitch N1 of the dummy line may be 2.4-3.3 um, and the pitch Pi of the signal line 29 may be 2.3-3.3 um.

Embodiments of the present disclosure also provide a display device including the above display substrate.

The display device includes, but is not limited to: a radio frequency unit, a network module, an audio output unit, an input unit, a sensor, a display unit, a user input unit, an interface unit, a memory, a processor, a power supply, and the like. It will be appreciated by those skilled in the art that the configuration of the display device described above is not intended to be limiting and that the display device may include more or fewer of the components described above, or some combinations of the components, or different arrangements of the components. In embodiments of the present disclosure, the display device includes, but are not limited to, displays, cell phones, tablets, televisions, wearable electronics, navigation display devices, and the like.

The display device may include: any product or component with a display function, such as a television, a display, a digital photo frame, a mobile phone, a tablet computer, where the display device further includes a flexible circuit board, a printed circuit board, and a back panel.

It should be noted that the various embodiments described herein are described in a progressive manner with reference to the same or similar parts throughout the various embodiments, with each embodiment focusing on differences from the other embodiments. In particular, the embodiments are described more simply because they are approximately similar to the product embodiments, with reference to the partial description of the product embodiments.

Unless defined otherwise, technical or scientific terms used in the present disclosure shall have the ordinary meaning as understood by one of ordinary skill in the art to which this disclosure belongs. Such terms as "first", "second" used in the present disclosure does not denote any order, quantity, or importance, but rather is used to distinguish one element from another. Such terms as "including" or "comprises" means that the presence of an element or item preceding the word covers the presence of the element or item listed after the word and equivalents thereof, but does not exclude other elements or items. Such terms as "connected" or "connected" are not limited to physical or mechanical connections, but may include electrical connections, whether direct or indirect. Such terms as "upper", "lower", "left", "right" are used only to indicate relative positional relationships that may change accordingly when the absolute position of the object being described changes.

It should be understood that when an element such as a layer, film, region, or substrate is referred to as being "on" or "under" another element, it can be "directly on" or "directly under" the other element or intervening elements may be present.

In the description of the embodiments above, particular features, structures, materials, or characteristics may be combined in any suitable manner in any one or more embodiments or examples.

The above are only specific embodiments of the present disclosure, but the protection scope of the present disclosure is not limited thereto. Anyone skilled in the art within the technical scope disclosed in the present disclosure can easily think of changes or substitutions, which shall fall within the protection scope of the present disclosure. Therefore, the protection scope of the present disclosure should be subjected to the protection scope of the claims.

What is claimed is:

1. A display substrate, comprising a base substrate and a signal line formed on the base substrate; wherein a slope angle of the signal line is 36.9 to 53.7 degrees, and the slope angle of the signal line is an angle between a side surface of an edge of the signal line and a plane where the base substrate is located;

wherein the display substrate comprises a display area and a peripheral area arranged around the display area, the peripheral area comprises an arc-shaped corner area close to an edge portion of the display area, the arc-shaped corner area is provided with a first signal line, the first signal line comprises a first straight-line portion, a second straight-line portion, and a first arc-shaped portion connecting the first straight-line portion and the second straight-line portion;

a radius of curvature of an inner boundary of the first arc-shaped portion is 3.5 μm to 4.5 μm, and a radius of curvature of an outer boundary of the first arc-shaped portion is 6 μm to 8 μm.

2. The display substrate according to claim 1, wherein the first straight-line portion comprises a first portion close to the first arc-shaped portion and a second portion at a side of the first portion away from the first arc-shaped portion, and a line width of the first portion is approximately equal to that of the second portion.

3. The display substrate according to claim 1, wherein the display substrate further comprises a set of dummy lines located between two adjacent first signal lines, each set of dummy lines comprises at least two dummy lines parallel to each other, and an extension direction of the dummy lines is the same as or approximately the same as an extension direction of the first straight-line portion;

a minimum distance between the first arc-shaped portion and the dummy line closest to the first arc-shaped portion is 4.5 μm to 5.5 μm.

4. A display device, comprising the display substrate according to claim 1.

5. The display substrate according to claim 3, wherein a distance between adjacent dummy lines is 2.0 μm to 2.5 μm.

6. The display substrate according to claim 3, wherein each set of dummy lines comprises two dummy lines parallel to each other.

7. The display substrate according to claim 3, wherein the peripheral area further comprises:

a second signal line close to the display area, the second signal line comprises: a second arc-shaped portion and a third straight-line portion connected to the second arc-shaped portion;

a radius of curvature of an inner boundary of the second arc-shaped portion is 3.5 μm to 4.5 μm, and a radius of curvature of an outer boundary of the second arc-shaped portion is 6 μm to 8 μm.

8. The display substrate according to claim 3, wherein the peripheral area further comprises:

the second signal line close to the display area, the second signal line comprising the second arc-shaped portion and the third straight-line portion connected to the second arc-shaped portion;

a plurality of third signal lines parallel to the third straight-line portion, the third signal lines being located on a side of the third straight-line portion away from the display area, wherein a line width of the third signal line is approximately equal to that of the third straight-line portion.

* * * * *